(12) United States Patent
Bian et al.

(10) Patent No.: US 7,300,480 B2
(45) Date of Patent: *Nov. 27, 2007

(54) HIGH-RATE BARRIER POLISHING COMPOSITION

(75) Inventors: Jinru Bian, Newark, DE (US); Kai Hu, Ambler, PA (US); Hugh Li, Ellicott City, MD (US); Zhendong Liu, Newark, DE (US); John Quanci, Haddonfield, NJ (US); Matthew R. VanHanehem, Bear, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/670,534

(22) Filed: Sep. 25, 2003

(65) Prior Publication Data

US 2005/0066585 A1    Mar. 31, 2005

(51) Int. Cl.
C09G 1/02    (2006.01)
C09G 1/04    (2006.01)

(52) U.S. Cl. .............................. 51/307; 51/308; 51/309; 106/3; 252/79.1; 510/397; 510/380; 510/175; 510/367; 510/368; 510/369; 510/370; 510/375

(58) Field of Classification Search ................. 51/307, 51/308, 309; 106/3; 252/79.1; 510/175, 510/367, 368, 369, 370, 375, 379, 380, 397, 510/387
See application file for complete search history.

(56) References Cited

U.S. PATENT DOCUMENTS

| | | | |
|---|---|---|---|
| 3,895,956 A | | 7/1975 | Yoshida et al. |
| 5,281,749 A | * | 1/1994 | Uphues et al. ................. 562/40 |
| 5,391,258 A | | 2/1995 | Brancaleoni et al. |
| 5,676,587 A | | 10/1997 | Landers et al. |
| 5,860,848 A | | 1/1999 | Loncki et al. |
| 5,985,748 A | | 11/1999 | Watts et al. |
| 6,001,730 A | | 12/1999 | Farkas et al. |
| 6,436,834 B1 | * | 8/2002 | Lee et al. .................... 438/693 |
| 6,447,695 B1 | | 9/2002 | Motonari et al. |
| 2001/0055880 A1 | | 12/2001 | Li et al. |
| 2002/0016073 A1 | | 2/2002 | Kondo et al. |
| 2002/0019202 A1 | | 2/2002 | Thomas et al. |
| 2002/0022370 A1 | | 2/2002 | Sun et al. |
| 2002/0025605 A1 | | 2/2002 | Homma et al. |
| 2002/0025762 A1 | | 2/2002 | Luo et al. |
| 2002/0031985 A1 | * | 3/2002 | Wang et al. ................... 451/41 |
| 2002/0095874 A1 | | 7/2002 | Tsuchiya et al. |
| 2002/0104268 A1 | * | 8/2002 | Tsuchiya et al. ............... 51/307 |
| 2002/0197937 A1 | | 12/2002 | Economikos et al. |
| 2003/0041526 A1 | * | 3/2003 | Fujii et al. ..................... 51/307 |
| 2003/0131535 A1 | | 7/2003 | Small et al. |
| 2003/0170991 A1 | * | 9/2003 | Wang et al. ................. 438/692 |
| 2003/0178320 A1 | * | 9/2003 | Liu et al. .................... 205/640 |
| 2003/0181345 A1 | | 9/2003 | Bian |
| 2004/0147118 A1 | | 7/2004 | Liu et al. |
| 2004/0171265 A1 | * | 9/2004 | Ye et al. ..................... 438/692 |
| 2005/0029491 A1 | | 2/2005 | Liu et al. |
| 2005/0031789 A1 | | 2/2005 | Liu et al. |
| 2005/0070211 A1 | * | 3/2005 | Bian ........................... 451/36 |
| 2005/0236601 A1 | * | 10/2005 | Liu et al. .................... 252/79.1 |

FOREIGN PATENT DOCUMENTS

| | | |
|---|---|---|
| EP | 0 678 571 B1 | 10/1995 |
| EP | 1 072 662 A1 | 1/2001 |
| EP | 1 137 056 A1 | 9/2001 |
| EP | 1 150 341 A1 | 10/2001 |
| EP | 1 223 609 A1 | 7/2002 |
| EP | 1 229 093 A | 8/2002 |
| EP | 1 279 708 A | 1/2003 |
| GB | 679561 | 9/1952 |
| WO | WO 96/38262 A1 | 12/1996 |
| WO | WO 01/12740 A1 | 2/2001 |

* cited by examiner

*Primary Examiner*—Michael Marcheschi
(74) *Attorney, Agent, or Firm*—Blake T. Biederman

(57) ABSTRACT

The solution is useful for removing a barrier material from a semiconductor substrate. The solution comprises, by weight percent, 0.01 to 25 oxidizer, 0 to 15 inhibitor for a nonferrous metal, 0 to 15 abrasive, 0 to 20 complexing agent for the nonferrous metal, 0.01 to 12 barrier removal agent and balance water. The barrier removal agent is selected from the group comprising imine derivative compounds, hydrazine derivative compounds and mixtures thereof.

5 Claims, No Drawings

HIGH-RATE BARRIER POLISHING COMPOSITION

BACKGROUND

The invention relates to polishing semiconductor substrates and, more particularly, to polishing fluids for removing a barrier layer.

Circuit interconnects for semiconductor devices can be formed in a dielectric layer in which multiple trenches are arranged. The interconnects are formed by applying a barrier film over the underlying dielectric layer, followed by applying a metal layer over the barrier film. The metal layer is formed to a sufficient thickness to fill the trenches with metal. The interconnect fabrication process includes the use of a two-step chemical mechanical polishing (CMP) process.

CMP refers to a process of polishing a semiconductor wafer with a polishing pad and a polishing fluid. In a first polishing step, the metal layer is removed from the underlying barrier film and from the underlying dielectric layer. The metal layer is removed, both by abrasion applied by the polishing pad, and by chemical reaction with the polishing fluid accompanied by dissolution of the products of chemical reaction. The first polishing step removes the metal layer, leaving a smooth planar polished surface on the wafer, and further leaving metal in the trenches to provide circuit interconnects that are substantially planar with the polished surface. For example, Lee et al., in EP Pat. Pub. No. 1 072 662 A1, disclose the use of guanidine as an abrasion accelerator for accelerating an abrasive composition's dielectric removal rate in relation to a metal interconnect.

A typical first-step polishing process includes an aqueous solution having an oxidizing reagent, such as $KNO_3$ or $H_2O_2$, in a polishing fluid to remove copper interconnects. The copper metal layer is removed by oxidation of the metal layer by the oxidizing reagent, and by abrasion originating from the polishing pad. Further, the polishing pad abrades the metal layer to minimize redeposition of the dissolved oxides from the solution onto the surface of the material being polished. The copper is removed from an underlying barrier film, for example, of tantalum (Ta) or tantalum nitride (TaN). The barrier film is more resistant to abrasion than is the copper, such that the barrier film acts as a polish stop for stopping the first-step polishing of copper. Further, oxidation of the surface of the barrier film by the polishing fluid will inhibit its removal during first-step polishing.

In a second polishing step, the barrier film is removed from the underlying dielectric layer. Second-step polishing can provide a smooth, planar polished surface on the dielectric layer. Ideally, the second polishing step does not remove excessive metal in the trenches. Excess metal removal in the second polishing step can contribute to dishing.

Dishing is a term of art that describes the formation of unwanted cavities in the circuit interconnects caused by removing excess metal in the trenches. Dishing can occur in both the first polishing step and in the second polishing step. The circuit interconnects are required to have precise dimensions that determine the electrical impedance of signal transmission lines, as provided by the circuit interconnects. Dishing in excess of acceptable levels causes dimensional defects in the circuit interconnects, which can contribute to attenuation of electrical signals transmitted by the circuit interconnects.

The second polishing step should cause minimal erosion. Erosion is a term of art that describes the unwanted lowering of the surface of the dielectric layer caused by removing some of the dielectric layer underlying the barrier film. Erosion that occurs adjacent to the metal in the trenches causes dimensional defects in the circuit interconnects, which can contribute to attenuation of electrical signals transmitted by the circuit interconnects. To minimize erosion, a polishing fluid for second-step polishing is desired to remove the barrier film with a higher removal rate than the removal rate for the dielectric layer.

The second polishing step should have a high removal selectivity for the barrier layer relative to the underlying layers. Removal selectivity is defined as a ratio of the removal rate of the barrier film, relative to the removal rate of the comparison layer, for example a dielectric layer or a metal film. For purposes of this specification, selectivity refers to the ratio in removal rate in distance per unit time, such as angstroms per minute. Thus, removal selectivity is a measure of the removal of the barrier film relative to the dielectric layer or the metal film. A high removal selectivity is desired for several integration schemes. Polishing with a polishing fluid that exhibits a high removal selectivity relative to the dielectric layer increases removal of the barrier layer or film and decreases removal of the dielectric layer. There is a desire for a polishing solution with an increased barrier layer removal rate and a decreased dielectric removal rate.

STATEMENT OF INVENTION

The invention provides a solution useful for removing a barrier material from a semiconductor substrate comprising by weight percent 0.01 to 25 oxidizer, 0 to 15 inhibitor for a nonferrous metal, 0 to 15 abrasive, 0 to 20 complexing agent for the nonferrous metal, 0.01 to 12 barrier removal agent selected from the group comprising imine derivative compounds, hydrazine derivative compounds and mixtures thereof, and balance water; and the solution has a tantalum nitride to CDO selectivity of at least 2 to 1 as measured with a microporous polyurethane polishing pad with at least one pressure measured normal to a wafer of equal to or less than 13.8 kPa.

In an additional aspect, the invention provides a solution useful for removing a barrier material from a semiconductor substrate comprising by weight percent 0.1 to 15 oxidizer, 0 to 10 inhibitor for a nonferrous metal, 0 to 10 complexing agent for the nonferrous metal, 0 to 10 oxidizer, 0.1 to 10 barrier removal agent selected from the group comprising acetamidine, acetamidine salts, acetamidine derivatives, arginine, arginine salts, argine derivatives, formamidine, formamidine salts, formamidine derivatives, guanidine derivatives, guanidine salts and mixtures thereof, 0.01 to 10 organic-containing ammonium salt formed with

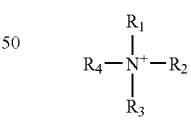

$R_1$, $R_2$, $R_3$ and $R_4$ are radicals, $R_1$ has a carbon chain length of less than 15 carbon atoms and balance water and the solution has a pH less than 7.

In an additional aspect of the invention, the invention provides a method for removing a barrier material from a semiconductor wafer comprising the steps of: contacting a wafer substrate with a polishing solution, the wafer substrate containing a barrier material, a TEOS dielectric layer and a second dielectric layer, the second dielectric layer having a dielectric constant lower than the TEOS dielectric layer and the polishing solution containing an oxidizer and a barrier removal agent selected from the group comprising imine derivative compounds, hydrazine derivative compounds and mixtures thereof, polishing the wafer substrate with a polishing pad to remove the barrier material from the wafer substrate; and polishing the wafer substrate with the polishing pad to remove at least a portion of the TEOS dielectric layer from the wafer substrate and leave the second dielectric layer.

DETAILED DESCRIPTION

It has been discovered that adjusting pH level and oxidizer concentration facilitates increased barrier removal rates for polishing solutions containing imine and hydrazine derivative compounds. In addition, the solution and method provide unexpected selectivity and control for removing barrier materials. The solution relies upon an oxidizer with a barrier removal agent selected from the group comprising imine and hydrazine derivative compounds and mixtures thereof to selectively remove barrier materials, such as tantalum-containing and titanium-containing dielectrics. The solution removes barrier materials with reduced dielectric erosion and reduced dishing, erosion and scratching of the metal interconnects, such as copper. Furthermore, the solution removes tantalum barrier materials without peeling or delaminating low-k dielectric layers from semiconductor wafers. In addition, the solution can have a controlled TEOS removal rate for hardmasks formed from silicon dioxide deposited from tetraethylorthosilicate (TEOS) precursors.

In particular, the solution includes a barrier removal agent to remove barrier materials, such as, tantalum, tantalum nitride, tantalum-silicon nitrides, titanium, titanium nitrides, titanium-silicon nitrides, titanium-titanium nitrides, titanium-tungsten, tungsten, tungsten nitrides and tungsten-silicon nitrides. Although the solution is effective for titanium-containing barrier materials at acidic pH levels. The solution has particular effectiveness for tantalum-containing materials. For purposes of the specification, tantalum containing materials include tantalum, tantalum-base alloys and tantalum intemetallics, such as tantalum carbides, nitrides and oxides. The slurry is most effective for removing tantalum-containing barriers from patterned semiconductor wafers.

Preferred imine derivatives include compounds of formula (I):

where $R^1$ is —H or —$NH_2$ and $R^2$ is —H, —$NH_2$, a hydrocarbon group, an amino group, a carbonyl group, an imido group, an azo group, a cyano group, a thio group, or a seleno group and —$OR^7$ where $R^7$ is a hydrocarbon group.

Preferred hydrazine derivatives include compounds of formula (II):

and where $R^3$, $R^4$, $R^5$, and $R^6$ are independently —H, —$OR^7$, —$NH_2$, a hydrocarbon group, a carbonyl group, an imido group, an azo group, a cyano group, a thio group, or a seleno group.

The term "nitrogen-containing" refers to a substance containing two or more nitrogen. Two or more nitrogen atoms in a nitrogen-containing substance may be bonded to each other, or they may be separated by other atoms. If a nitrogen-containing substance contains three or more nitrogen atoms, some of the nitrogen atoms may be bonded to each other while others may be bonded to non-nitrogen atoms only. A nitrogen atom in a nitrogen-containing substance may be part of a chemical group within the substance, such as an amino, amido, azo, imino, imido, or hydrazino group. Preferably, the nitrogen atoms in a nitrogen-containing substance are in their reduced state and are not bonded directly to an oxygen atom (i.e. —$NO_2$; —$NO_3$).

The term "hydrocarbon group" refers to a straight, branched or cyclic chain of carbon atoms substituted with hydrogen atoms, and includes unsubstituted and substituted alkyl groups, alkenyl groups, alkynyl groups, aryl groups, and heterocyclyl groups. Preferably, a hydrocarbon group contains from 1 to 20 carbon atoms. A hydrocarbon group may optionally be substituted with other groups. The bonds between the carbon atoms may be independently selected from single bonds, double bonds, and triple bonds.

The term "alkyl" (or alkyl- or alk-) refers to a substituted or unsubstituted, straight, branched or cyclic hydrocarbon chain that preferably contains from 1 to 20 carbon atoms. Alkyl groups include, for example, methyl, ethyl, propyl, isopropyl, cyclopropyl, butyl, iso-butyl, tert-butyl, sec-butyl, cyclobutyl, pentyl, cyclopentyl, hexyl and cyclohexyl.

The term "alkenyl" (or alkenyl- or alken-) refers to a substituted or unsubstituted, straight, branched or cyclic hydrocarbon chain that contains at least one carbon-carbon double bond, and that preferably contains from 2 to 20 carbon atoms. Alkenyl groups include, for example, ethenyl (or vinyl, —CH=$CH_2$); 1-propenyl; 2-propenyl (or allyl, —$CH_2$—CH=$CH_2$); 1,3-butadienyl (—CH=CHCH=$CH_2$); 1-butenyl (—CH=CHCH$_2$CH$_3$); hexenyl; pentenyl; 1,3,5-hexatrienyl; cyclohexadienyl; cyclohexenyl; cyclopentenyl; cyclooctenyl; cycloheptadienyl; and cyclooctatrienyl.

The term "alkynyl" (or alkynyl- or alkyn-) refers to a substituted or unsubstituted, straight, branched or cyclic hydrocarbon chain that contains at least one carbon-carbon triple bond, and that preferably contains from 2 to 20 carbon atoms. Alkynyl groups include, for example, ethynyl (or acetylenyl, —C≡$CH_2$); 2-methyl-3-butynyl; and hexynyl.

The term "aryl" refers to any substituted or unsubstituted aromatic carbocyclic group that preferably contains from 3 to 20 carbon atoms. An aryl group can be monocyclic or polycyclic. Aryl groups include, for example, phenyl, naphthyl, biphenyl, benzyl, tolyl, xylyl, phenylethyl, benzoate, alkylbenzoate, aniline, and N-alkylanilino.

The term "heterocyclyl group" refers to a saturated, unsaturated, or aromatic ring moiety that contains one or more heteroatoms, and that preferably contains from 5 to 10, more preferably from 5 to 6, ring atoms. The term "ring atoms" refers to atoms that are incorporated into the ring structure and excludes other atoms that are pendant to the ring. The ring can be mono-, bi- or polycyclic. A heterocyclic group contains carbon atoms and from 1 to 3 heteroatoms independently selected from the group consisting of nitrogen, oxygen, and sulfur. Heterocyclic groups, which may also be substituted or unsubstituted, include, for example, benzimidazole, benzothiazole, furan, indole, isoquinoline, isothiazole, morpholine, piperazine, pyrazine, pyrazole, pyridine, pyrimidine, pyrrole, quinoline, thiazole, thiophene, triazines and triazole.

The term "substituted," when used to describe a chemical group, refers to a chemical moiety that contains at least one, preferably from 1 to 5 substituents. Suitable substituents include, for example, hydroxyl (—OH), amino (—$NH_2$), oxy (—O—), carbonyl (>C=O), thiol, alkyl, halo, nitro, aryl and heterocyclic groups. These substituents can optionally be further substituted with from 1 to 5 substituents.

The term "amino group" refers to a group bonded to a substance through a nitrogen atom. For example, an amino group may be selected from the group comprising —NH$_2$; alkylamino (—NH-alkyl); dialkylamino (—N-(alkyl)$_2$); arylamino (—NH-aryl); and substituted derivatives thereof. Preferably, the alkyl groups bonded to the nitrogen contain from 1 to 20 carbon atoms, and the aryl groups bonded to the nitrogen contain from 3 to 20 carbon atoms. The alkyl groups in a dialkylamino group may be the same or may be different.

The term "carbonyl group" refers to a group containing a carbon atom doubly bonded to an oxygen atom, and includes carboxylic acids, anhydrides, carbonates, aldehydes, ketones, esters, carboxylic acid halides, and amides. For example, a carbonyl group may have the general formula (III):

where $R^8$ is —H, —OH, —OR$^9$, —R$^{10}$, —NH$_2$, and —NH—C(=O)—R$^{11}$; and R$^9$, R$^{10}$, and R$^{11}$ are independently alkyl groups containing from 1 to 10 carbon atoms.

The term "imido group" refers to a group containing a carbon atom doubly bonded to an —NH group. For example, an imido group may have the general formula (IV):

where $R^{12}$ is —H, —NH$_2$, or an alkyl group containing from 1 to 10 carbon atoms.

The term "azo group" refers to a group containing a nitrogen-nitrogen double bond, or an —NH group singly bonded to another —NH group. For example, an azo group may be selected from the group consisting of —N$_3$; —NH—NH—NH$_3$; —N=N—NH$_3$; —N=N—R$^{13}$; —R$^{14}$=N—N=R$^{15}$; and —NH—NH—R$^{16}$; where R$^{13}$, R$^{14}$, R$^{15}$, and R$^{16}$ are independently alkyl groups containing from 1 to 10 carbon atoms.

The term "cyano group" refers to a group containing a triple bond between a carbon atom and a nitrogen atom, or a carbon atom doubly bonded to a nitrogen atom and also doubly bonded to another heteroatom such as oxygen, sulfur, or selenium. For example, a cyano group may be selected from the group consisting of —C≡N; —N≡C; —N=C=O; —N=C=S; and —N=C=Se.

The term "thio group" refers to a group containing a sulfur atom singly bonded to another atom. For example, a thio group may be selected from the group consisting of —S—R$^{17}$; —S—S—R$^{18}$; —S—C≡N; —SO$_2$H; and —SOH; where R$^{17}$ and R$^{18}$ are independently alkyl groups containing from 1 to 10 carbon atoms.

The term "seleno group" refers to a group containing a selenium atom singly bonded to another atom. For example, a seleno group may be selected from the group consisting of —Se—R$^{19}$; —Se—Se—R$^{20}$; and —Se—C≡N; where R$^{19}$ and R$^{20}$ are independently alkyl groups containing from 1 to 10 carbon atoms.

Example imine derivatives include acetamidine, acetamidine salts, acetamidine derivatives, arginine, arginine salts, argine derivatives, formamidine, formamidine salts, formamidine derivatives, guanidine derivatives, guanidine salts and mixtures thereof. Preferred imine derivatives of formula (I) include, for example, acetamidine hydrochloride, amino-guanidine hydrochloride, arginine, formamidine, formamidinesulfinic acid, formamidine acetate, 1,3-diphenyl guanidine, 1-methyl-3-nitroguanidine, guanidine hydrochloride, tetramethylguanidine, 2,2-azobis(dimethyl-propionamidine)di-HCl, guanidine sulfate, guanidine acetic acid, guanidine carbonate, guanidine nitrate and mixtures thereof.

Preferred hydrazine derivatives of formula (II) include, for example, carbohydrazide, acetic hydrazide, semicarbazide hydrochloride, 1,2-diformylhydrazine, methylhydrazino-carboxylate, oxalic dihydrazide, acetone azine and formic hydrazide and mixtures thereof.

For basic pH levels, imine derivative compounds of formula (I) preferably contain an electron-donating substituent as R$^1$ or R$^2$, and are free of electron-withdrawing substituents. More preferably, one of R$^1$ and R$^2$ is an electron-donating substituent, and the other substituent is either hydrogen or an electron-donating substituent. If two electron-donating substituents are present in an imine derivative compound, the substituents may be the same, or they may be different.

Imine derivative compounds of formula (II) preferably contain a hydrazine functionality (>N—NH$_2$) and contain no more than one electron-withdrawing substituent. A hydrazine functionality is provided when R$^3$ and R$^4$ are both hydrogen, or when R$^5$ and R$^6$ are both hydrogen.

For purposes of the specification, the term "electron-donating" refers to a chemical group bonded to a substance that transfers electron density to that substance. F. A. Carey and R. J. Sundberg, in *Advanced Organic Chemistry, Part A: Structure and Mechanisms*, 3$^{rd}$ Edition New York: Plenum Press (1990), p. 208 and 546-561 provide a more detailed description of electron-donating substituents. The imine derivative compounds have an electron-donating substituent that transfers sufficient electron density to the substance to establish a measurable partial positive charge on the substituent. Electron-donating substituents include, for example, amino, hydroxyl (—OH), alkyl, substituted alkyl, hydrocabon radical, substituted hydrocarbon radical, amido, and aryl. These electron-donating substituents accelerate removal of tantalum-containing barrier materials.

In addition, abrasive additions render imine and hydrazine derivative compounds effective with electron-withdrawing substituents. The term "electron-withdrawing" refers to a chemical group bonded to a substance that transfers electron density away from that substance. Electron-withdrawing substituents transfer sufficient electron density away from the substance to establish a measurable partial negative charge on the substituent and do not accelerate barrier removal. Electron-withdrawing substituents include, for example, —O-alkyl; -halogen; —C(=O)H; —C(=O)-alkyl; —C(=O)OH; —C(=O)-alkyl; —SO$_2$H; —SO$_3$H; and —NO$_2$. The carbonyl groups that are electron-withdrawing are not amide groups.

The tantalum barrier removal agent may be acetamidine, acetamidine salts, acetamidine derivatives, arginine, arginine salts, argine derivatives, formamidine, formamidine salts, formamidine derivatives, guanidine derivatives, guanidine salts and mixtures thereof. These barrier removal agents appear to have a strong affinity for tantalum barrier materials and titanium-containing materials at acidic pH levels. This affinity appears to accelerate the barrier removal rate with limited abrasive or optionally, without the use of any abrasives. This limited use of abrasive allows the polishing to remove the tantalum barrier at a rate greater than the dielectric and the metal interconnect. Particular effective derivatives and salts include acetamidine hydrochloride, amino-guanidine hydrochloride, arginine, formamidine, formamidinesulfinic acid, formamidine acetate, guanidine hydrochloride, guanidine sulfate, guanidine acetic acid, guanidine carbonate, guanidine nitrate and mixtures thereof. Preferably, the solution contains 0.01 to 12 weight percent barrier removal agent. For purposes of this specification, all concentrations have values expressed in weight percent based upon the total weight of the polishing composition, unless specifically noted otherwise. Most preferably, the solution contains 0.1 to 10 weight percent barrier removal agent and for most applications, barrier removal agent concentrations between 0.2 and 6 weight percent provide sufficient barrier removal rates.

The barrier removal agent provides efficacy over a broad pH range in solutions containing a balance of water. This solution's useful pH range extends at least from 2 to 12. Preferably, the solution has a pH between 2 and 7. Most preferably, the solutions pH is between 5 and 6. Typical agents for adjusting pH downward include nitric acid, sulfuric acid, hydrochloric acid, phosphoric acid and organic acids. Most preferably, potassium hydroxide and nitric acid provide final pH adjustments, as required. In addition, the solution most preferably relies upon a balance of deionized water to limit incidental impurities.

The composition contains 0.01 to 25 weight percent oxidizer. The oxidizer is particularly effective in allowing operation of the slurry at acidic pH levels. Preferably, the solution contains 0.01 to 15 weight percent oxidizer. Most preferably, the solution contains 0.01 to 5 weight percent oxidizer. The oxidizing agent can be at least one of a number of oxidizing compounds, such as hydrogen peroxide, monopersulfates, iodates, magnesium perphthalate, peracetic acid, persulfates, bromates, perbromates, perchlorates, periodates, ferric nitrate, iron salts, cerium salts, Mn (III) salts, Mn(IV) salts and Mn (VI) salts, silver salts, copper salts, chromium salts, cobalt salts, halogens, hypochlorites and mixtures thereof. Furthermore, it is often advantageous to use a mixture of oxidizer compounds. Preferably, the oxidizer is either hydrogen peroxide or iodate. When the polishing slurry contains an unstable oxidizing agent, such as, hydrogen peroxide, it is often most advantageous to mix the oxidizer into the slurry at the point of use. At pH levels below 7, the solution requires an oxidizer to facilitate barrier removal. For acidic pH levels, the most advantageous oxidizer is hydrogen peroxide.

Suitable metals used for the interconnect include, for example, copper, copper alloys, gold, gold alloys, nickel, nickel alloys, platinum group metals, platinum group metal alloys, silver, silver alloys, tungsten, tungsten alloys and mixtures comprising at least one of the foregoing metals. The preferred interconnect metal is copper. In acidic polishing compositions and slurries that utilize oxidizers such as hydrogen peroxide, both the copper removal rate and the static etch rate are high primarily because of oxidation of the copper. In order to reduce the removal rate of the interconnect metal the polishing composition employs a corrosion inhibitor. The corrosion inhibitors function to reduce removal of the interconnect metal. This facilitates improved polishing performance by reducing the dishing of the interconnect metal.

The inhibitor is typically present in an amount of 0 to 6 wt %—the inhibitor may represent a single or a mixture of inhibitors to the interconnect metal. Within this range, it is desirable to have an amount of inhibitor greater than or equal to 0.0025 wt %, preferably greater than or equal to 0.25 wt %. Also desirable within this range is an amount of less than or equal to 4 wt %, preferably less than or equal to 1 wt %. The preferred corrosion inhibitor is benzotriazole (BTA). In one embodiment, the polishing composition may contain a relatively large quantity of BTA inhibitor for reducing the interconnect removal rate. At BTA concentrations above 0.25 wt %, an addition of supplemental corrosion inhibitors may be unnecessary. The preferred concentration of BTA is an amount of 0.0025 to 2 wt %.

Exemplary complexing agents for optional use in the polishing fluid include acetic acid, citric acid, ethyl acetoacetate, glycolic acid, lactic acid, malic acid, oxalic acid, salicylic acid, sodium diethyl dithiocarbamate, succinic acid, tartaric acid, thioglycolic acid, glycine, alanine, aspartic acid, ethylene diamine, trimethylene diamine, malonic acid, gluteric acid, 3-hydroxybutyric acid, propionic acid, phthalic acid, isophthalic acid, 3-hydroxy salicylic acid, 3,5-dihydroxy salicylic acid, gallic acid, gluconic acid, pyrocatechol, pyrogallol, gallic acid, tannic acid and salts thereof. Preferably, the complexing agent used in the polishing fluid is citric acid. Most preferably, the polishing fluid contains 0 to 15 weight percent complexing agent.

Although the nitrogen-containing polishing agents provide efficacious abrasive-free polishing fluids, it may be desirable to add an abrasive to the polishing fluid in some applications. The polishing composition may optionally contain up to 25 wt % abrasive to facilitate silica removal or combined barrier and silica removal—depending upon the integration scheme, the polishing composition may serve to i) remove the mask layer or film underlying the barrier layer; or ii) to first remove a barrier layer and then remove a silicon oxide-containing layer. The polishing composition optionally includes an abrasive for "mechanical" removal of barrier layers. The abrasive is preferably a colloidal abrasive. Example abrasives include inorganic oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), or combinations comprising at least one of the foregoing oxides. Modified forms of these inorganic oxides such as polymer-coated inorganic oxide particles and inorganic coated particles may also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Diamond may also be utilized as an abrasive if desired. Alternative abrasives also include polymeric particles and coated polymeric particles. The preferred abrasive is silica.

To limit erosion and dishing, it is advantageous to use the abrasive in an amount of less than 5 weight percent. Using less than 1 weight percent abrasive further facilitates limiting dishing and erosion. Most preferably, the polishing fluid contains no abrasive to further reduce dishing and erosion.

The abrasive has an average particle size of less than or equal to 150 nanometers (nm) for preventing excessive metal dishing and dielectric erosion. For purposes of this specification, particle size refers to the average particle size of the abrasive. It is desirable to use a colloidal abrasive having an average particle size of less than or equal to 100 nm, preferably less than or equal to 50 nm. The least dielectric erosion and metal dishing preferably occurs with colloidal silica having an average particle size of less than or equal to 40 nm. Decreasing the size of the colloidal abrasive to less than or equal to 40 nm, tends to improve the selectivity of the polishing composition; but it also tends to decrease the barrier removal rate. In addition, the preferred colloidal abrasive may include additives, such as dispersants, surfactants and buffers to improve the stability of the colloidal abrasive at acidic pH ranges. One such colloidal abrasive is colloidal silica from Clariant S. A., of Puteaux, France. The chemical mechanical planarizing composition can also optionally include brighteners, such as, ammonium chloride, complexing agents, chelating agents, pH buffers, biocides and defoaming agents.

If the polishing composition does not contain abrasives, then pad selection and conditioning become more important to the chemical mechanical planarizing (CMP) process. For example, for some abrasive-free compositions, a fixed abrasive pad improves polishing performance.

It has been found that ammonium salts facilitate controlled removal rate of silicon oxide-containing layers, such as TEOS layers at acidic pH levels, and thus permit controlling the silicon oxide-containing material's removal rate. Furthermore, these salts allow the removal of dielectrics with little detrimental impact upon barrier removal rates. The ammonium salts are organic ammonium salts formed with compounds to include the structure:

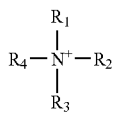

$R_1$, $R_2$, $R_3$ and $R_4$ are radicals that can be the same or different. The composition operates at acidic pH levels where the ammonium compound becomes ionized. Example anions include, nitrate, sulfate, halides (such as, bromide, chloride, fluoride and iodide), citrate, phosphate, oxalate, malate, gluconate, hydroxide, acetate, borate, lactate, thiocyanate, cyanate, sulfonate, silicate, per-halides (such as, perbromate, perchlorate and periodate), chromate, and mixtures comprising at least one of the foregoing anions. These ammonium salts act at pH levels less than 7 to accelerate TEOS removal rate. It is possible to add the salt directly to the composition or to form the salt in situ. For example, adding tetramethylammonium hydroxide to a nitric acid solution at a pH of 2.5 forms the tetramethylammonium nitrate.

A preferable ammonium salt combination is that formed from reacting tetrabutylammonium hydroxide with hydrofluoric acid. This combination reacts at low pH levels to form a tetrabutylammonium fluoride salt. Although the exact mechanism is unclear (The fluoride salt dissociates to provide fluoride ions in solution.), having organic ammonium fluoride salts in solution further accelerates the TEOS removal rate.

$R_1$ is an organic that has a carbon chain length of less than 15 carbon atoms. More preferably, $R_1$ has a carbon chain length of 2 to 10. Most preferably, $R_1$ has a carbon chain length of 2 to 5 carbon atoms. The organic of $R_1$ may be a substituted or unsubstituted aryl, alkyl, aralkyl or alkaryl group.

Preferably, $R_2$, $R_3$ and $R_4$ are an organic compound, such as, a substituted or unsubstituted aryl, alkyl, aralkyl, or alkaryl group; or hydrogen. If $R_2$, $R_3$ or $R_4$ is an organic compound, then the organic compound preferably has a carbon chain length of less than 15 carbon atoms; more preferably, it has a carbon chain length of 2 to 10 carbon atoms; and most preferably it has a carbon chain length of 2 to 5 carbon atoms.

Suitable compounds for forming ammonium salts include tetramethyl ammonium, tetraethyl ammonium, tetrabutylammonium, benzyltributylammonium, benzyltrimethylammonium, benzyltriethylammonium, diallyldimethylammonium, diethylaminoethyl methacrylate, dimethylaminoethyl methacrylate, methacryloyloxyethyltrimethylammonium, 3-(methacrylamido)propyltrimethylammonium, triethylenetetramine, tetramethylguanidine, hexylamine and mixtures comprising at least one of the foregoing ammonium salts. Specific ammonium salts include tetramethyl ammonium nitrate, tetramthyl ammonium chloride, tetramethyl ammonium fluoride, tetraethyl ammonium nitrate, tetrabutylammonium fluoride, tetraethylammonium nitrate, tetraethylammonium fluoride, benzyltributylammonium chloride, benzyltrimethylammonium chloride, benzyltriethylammonium chloride, diallyldimethylammonium chloride, diallyldiethylammonium chloride, diethylaminoethyl methacrylate, dimethylaminoethyl methacrylate, methacryloyloxyethyltrimethylammonium sulfate, methacryloyloxyethyltrimethylammonium chloride, 3-(methacrylamido) propyltrimethylammonium chloride, triethylenetetramine, tetramethylguanidine, hexylamine and mixtures comprising at least one of the foregoing. The preferred ammonium salts are tetraethyl ammonium salts, tetrabutylammonium salts, benzyltributylammonium salts, benzyltrimethylammonium salts and benzyltriethylammonium salts.

The ammonium salts are present in an amount of 0.001 to 10 wt %. Most preferably, the solution contains 0.01 to 5 wt % ammonium salt. Preferably, the polishing composition is present in an amount of greater than or equal to 0.02 wt %, and preferably greater than or equal to 0.05 wt %. Also desirable within this range is an amount of less than or equal to 5, preferably less than or equal to 2, and more preferably less than or equal to 1 wt %.

The solution provides a tantalum nitride to CDO selectivity of at least 2 to 1 as measured with a microporous polyurethane polishing pad with at least one polishing pad pressure measured normal to a wafer of equal to or less than 13.8 kPa. A particular polishing pad useful for determining selectivity is the IC1000™ microporous polyurethane polishing pad. Preferably, the solution provides a tantalum nitride to CDO selectivity of at least 3 to 1 as measured with a microporous polyurethane polishing pad pressure with at lest one polishing pad pressure measured normal to a wafer of equal to or less than 13.8 kPa; and most preferably, this range is at least 5 to 1. Adjusting the pH, oxidizer concentration and tantalum removal agent concentrations adjusts the tantalum barrier removal rate. Adjusting the inhibitor, oxidizer, complexing agent, abrasive concentration, abrasive size and leveler concentrations adjusts the etch rate of the interconnect metals.

EXAMPLES

The polish conditions for Examples 1 to 4 were as follows:
Polisher: Strasbaugh 6-EC™ Polisher
Polish Downforce: 2 psi (13.8 kPa)
Polish Platen Speed: 120 rpm
Polish Carrier Speed: 114 rpm
Slurry Flow rate: 200 ml/in
Polish pad: IC1000™ pad (Rodel, Inc.)
Polish time: 1 minute.

All slurries listed in the following Examples contained 2 wt % silica abrasive having a weight-average particle size of 25 nm and relied upon nitric acid and potassium hydroxide to obtain the target pH levels and a balance deionized water, unless specifically noted otherwise. In the Examples, numerals represent examples of the invention and letters represent comparative slurries.

Example 1

In this example, we compare the removal rates of Ta, TaN and Cu of four slurries polished on the Strasbaugh 6-EC polisher, as shown in Table 1. The Slurries A and 1 contained 0.50 wt % guanidine hydrochloride in deionized water.

Comparative Slurry A did not contain the oxidizer $H_2O_2$, while Slurry 1 did contain 0.50% wt. of $H_2O_2$. The remaining comparative slurries, Slurries B and C, did not contain any guanidine hydrochloride. Slurry B did not contain $H_2O_2$, while Slurry C contained 0.30% wt. of $H_2O_2$. The pH level of all slurries was adjusted to 5.0.

TABLE 1

| Slurry | BTA (wt %) | Abrasive (wt %) | GHC (wt %) | $H_2O_2$ (wt %) | pH | Ta (Å/min) | TaN (Å/min) | Cu (Å/min) |
|---|---|---|---|---|---|---|---|---|
| A | 0.10 | 2.00 | 0.50 | 0.00 | 5.00 | 60 | 260 | 120 |
| B | 0.10 | 2.00 | 0.00 | 0.00 | 5.00 | 0 | 368 | 33 |
| C | 0.10 | 2.00 | 0.00 | 0.30 | 5.00 | 35 | 101 | 126 |
| 1 | 0.10 | 2.00 | 0.50 | 0.5 | 5.00 | 700 | 1537 | 107 |

The results from comparing Slurries A and 1 show that the combination of guanidine hydrochloride and $H_2O_2$ significantly increased the removal rates of Ta and TaN. The comparative Slurries A to C that lacked the combination of guanidine and $H_2O_2$, provided very low Ta and TaN removal rates.

Example 2

This Example compares removal rates of slurries with the same amount of $H_2O_2$ oxidizer, but variable guanidine hydrochloride concentrations and pH levels, as shown in Table 2.

TABLE 2

| Slurry | BTA (wt %) | Abrasive (wt %) | GHC (wt %) | $H_2O_2$ (wt %) | pH | Ta Rate (Å/min) | TaN Rate (Å/min) | Cu Rate (Å/min) |
|---|---|---|---|---|---|---|---|---|
| D | 0.10 | 2.00 | 0.00 | 0.30 | 3.00 | 178 | 322 | 85 |
| 2 | 0.10 | 2.00 | 0.50 | 0.30 | 3.00 | 599 | 1513 | 58 |
| 3 | 0.10 | 2.00 | 1.00 | 0.30 | 3.00 | 835 | 1463 | 37 |
| E | 0.10 | 2.00 | 0.00 | 0.30 | 5.00 | 35 | 101 | 126 |
| 4 | 0.10 | 2.00 | 0.50 | 0.30 | 5.00 | 530 | 1373 | 190 |
| 5 | 0.10 | 2.00 | 1.00 | 0.30 | 5.00 | 604 | 1620 | 37 |
| F | 0.10 | 2.00 | 0.00 | 0.30 | 7.00 | 35 | 34 | 149 |
| 6 | 0.10 | 2.00 | 1.00 | 0.30 | 7.00 | 426 | 1071 | 128 |

At each pH level, the increase in guanidine hydrochloride concentration increased the removal rates of Ta and TaN. In addition, the pH level had an impact upon the Ta and TaN removal rates.

Example 3

Table 3 compares removal rates of slurries with the same amount of guanidine hydrochloride concentration of 0.5% wt. at pH 5, but variable concentration of the $H_2O_2$ oxidizer.

TABLE 3

| Slurry | BTA (wt %) | Abrasive (wt %) | GHC (wt %) | $H_2O_2$ (wt %) | pH | Ta (Å/min) | TaN Rate (Å/min) | Cu Rate (Å/min) |
|---|---|---|---|---|---|---|---|---|
| G | 0.10 | 2.00 | 0.50 | 0 | 5.00 | 60 | 260 | 120 |
| 7 | 0.10 | 2.00 | 0.50 | 0.3 | 5.00 | 530 | 1373 | 190 |
| 8 | 0.10 | 2.00 | 0.50 | 0.6 | 5.00 | 700 | 1537 | 107 |
| 9 | 0.10 | 2.00 | 0.50 | 2 | 5.00 | 551 | 1158 | 554 |
| 10 | 0.10 | 2.00 | 0.50 | 4 | 5.00 | 459 | 1125 | 1390 |

The removal rates for both Ta and TaN were functions of the $H_2O_2$ concentration. These removal rates have maximum values at about 0.6 wt % $H_2O_2$. In addition, the Cu removal rate increases with higher $H_2O_2$ concentration. This facilitates selecting a desired Cu removal rate to obtain the required Ta:Cu selectivity. The above examples demonstrate that the removal rates of Ta and TaN are functions of the guanidine hydrochloride concentration, the $H_2O_2$ concentration and pH level. Thus, fine-tuning the concentrations of guanidine hydrochloride and $H_2O_2$, at any preferred pH level can provide a desired Ta or TaN removal rate.

Example 4

In addition, a preferred pH level may optimize the removal rates of other materials, such as dielectric materials. For example, silicon dioxide deposited from tetraethylorthosilicate (TEOS) precursor, also has a pH dependent removal rate. Furthermore, additional chemical additives, such as, organic-containing ammonium salts can selectively affect the TEOS removal rates to achieve a desired Ta:TEOS selectivity.

In this example, a series of slurries having varied concentrations of tetrabutylammonium nitrate (TBAN), concentrations of both guanidine hydrochloride and $H_2O_2$ are fixed at 0.5 wt %, and the pH fixed at 5.0, illustrated the TEOS removal rate increase capability of organic-containing ammonium salts. In this Example, the Strasbaugh 6-EC polisher's downforce was 1 psi (6.9 kPa) and abrasive particle concentration was 2.75 wt %.

TABLE 4

| Slurry | BTA (wt %) | Abrasive (wt %) | GHC (wt %) | $H_2O_2$ (wt %) | TBAN (wt %) | Final pH | Ta RR (Å/min) | TEOS (Å/min) | CDO (Å/min) |
|---|---|---|---|---|---|---|---|---|---|
| 11 | 0.15 | 2.75 | 0.50 | 0.5 | 0.00 | 5.00 | 357 | 119 | 71 |
| 12 | 0.15 | 2.75 | 0.50 | 0.5 | 0.10 | 5.00 | 356 | 109 | 47 |
| 13 | 0.15 | 2.75 | 0.50 | 0.5 | 0.25 | 5.00 | 377 | 179 | 45 |
| 14 | 0.15 | 2.75 | 0.50 | 0.5 | 0.50 | 5.00 | 367 | 265 | 46 |
| 15 | 0.15 | 2.75 | 0.50 | 0.5 | 1.00 | 5.00 | 420 | 373 | 48 |

The Ta removal rate was essentially constant while the TEOS removal rate increased from 119 Å/min to 373 Å/min. as the concentration of TBAN increased from 0% to 1%. Unlike TEOS, the TBAN concentration has essentially no impact upon CORAL carbon doped oxide (CDO), from Novellus Corporation (San Jose, Calif.). This allows controlled removal of a TEOS hardmask with minimal CDO removal.

We claim:

1. A solution useful for removing a barrier material from a semiconductor substrate comprising by weight percent 0.01 to 25 oxidizer, 0 to 15 inhibitor for a nonferrous metal, 0 to 15 abrasive, 0 to 20 complexing agent for the nonferrous metal, 0.01 to 12 barrier removal agent selected from imine derivative compounds

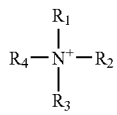
(I)

where the imine derivative compound is selected from formamidinesulfinic acid, 1,3-diphenyl guanidine, 1-methyl-3-nitroguanidine, guanidine hydrochloride, amino-guanidine hydrochloride, tetramethylguanidine, 2,2-azobis (dimethyl-propionamidine)di-HCl, guanidine sulfate, guanidine acetic acid, guanidine carbonate and guanidine nitrate or mixtures thereof, hydrazine derivative compounds $R^3R^4N—NR^5R^6$ (II)

where $R^3$, $R^4$, $R^5$, and $R^6$ are independently —H, —$OR^7$ where $R^7$ is a hydrocarbon group, —$NH_2$, a hydrocarbon group, a carbonyl group, an imido group, an azo group, a cyano group, a thio group, or a seleno group, and mixtures thereof, 0.01 to 10 organic-containing ammonium salt formed with

$R_1$, $R_2$, $R_3$ and $R_4$ are radicals, $R_1$, $R_2$, $R_3$ and $R_4$ are substituted or unsubstituted aryl, alkyl, aralkyl, or alkaryl group and have a carbon chain length of 2 to 10 carbon atoms and balance water; and the solution has a pH less than 7 and a tantalum nitride to CDO selectivity of at least 2 to 1 as measured with a microporous polyurethane polishing pad with at least one pressure measured normal to a wafer of equal to or less than 13.8 kPa.

2. The solution of claim 1 wherein the barrier removal agent is imine derivative compound and the imine derivative compound is present in an amount of 0.1 to 10 weight percent.

3. The solution of claim 1 wherein the oxidizer is selected from hydrogen peroxide, monopersulfates, iodates, magnesium perphthalate, peracetic acid, persulfates, bromates, perbromates, perchlorates, periodates, ferric nitrate, iron salts, cerium salts, Mn (III) salts, Mn(IV) salts and Mn (VI) salts, silver salts, copper salts, chromium salts, cobalt salts, halogens, hypochlorites or mixtures thereof.

4. The solution of claim 1 wherein the solution includes the hydrazine derivative compound and the hydrazine derivative compound is selected from carbohydrazide, acetic hydrazide, semicarbazide hydrochloride, 1,2-diformylhydrazine, methylhydrazino-carboxylate, oxalic dihydrazide, acetone azine and formic hydrazide and mixtures thereof.

5. The solution of claim 1 wherein the solution is abrasive-free.

* * * * *